(12) United States Patent
Hsu et al.

(10) Patent No.: US 6,462,421 B1
(45) Date of Patent: Oct. 8, 2002

(54) MULTICHIP MODULE

(75) Inventors: Kao-Yu Hsu, Kaohsiung Hsien; Su Tao, Kaohsiung, both of (TW)

(73) Assignee: Advanced Semicondcutor Engineering, Inc. (TW)

( * ) Notice: Subject to any disclaimer, the term of this patent is extended or adjusted under 35 U.S.C. 154(b) by 0 days.

(21) Appl. No.: 09/546,627

(22) Filed: Apr. 10, 2000

(51) Int. Cl.[7] ............................................... H01L 29/40
(52) U.S. Cl. ...................... 257/777; 257/723; 438/107
(58) Field of Search .............................. 257/777, 723, 257/685, 686; 438/107, 109

(56) References Cited

U.S. PATENT DOCUMENTS

| | | |
|---|---|---|
| 5,801,072 A | 9/1998 | Barber |
| 5,973,403 A | 10/1999 | Wark |
| 6,137,164 A * | 10/2000 | Yew et al. .................. 257/686 |

* cited by examiner

Primary Examiner—Roy Potter

(57) ABSTRACT

A multichip module mainly comprises a first chip disposed on the upper surface of a substrate by wire bonding and a second chip disposed on the lower surface of the substrate by flip-chip bonding wherein the first chip and the second chip are of the same type. The upper surface of the substrate is provided with a plurality of wire bondable pads for electrical connecting to the first chip. The lower surface of the substrate is provided with a plurality of flip-chip pads for electrical connecting to the second chip. According to the present invention, the first and second chips are both oriented face up (with their bonding pads up with respect to the substrate) for bonding to the substrate. Thus, address assignment of the bonding pads on the two semiconductor chips conforms to each other. Consequently, circuit layout on the upper and lower surfaces of the substrate can use substantially the same design wherein common conductive traces on the upper and lower surfaces of the substrate are electrically connected by plated through holes.

10 Claims, 3 Drawing Sheets

MULTICHIP MODULE

BACKGROUND OF THE INVENTION

1. Field of the Invention

This invention relates to a multichip module (MCM), and more specifically to a MCM comprising two semiconductor chips respectively wire bonded and flip-chip bonded to opposing surfaces of a substrate.

2. Description of the Related Art

As electronic devices have become more smaller and thinner, the packages for protecting and interconnecting IC chips have the same trend, too.

With ever increasing demands for miniaturization and higher operating speeds, multi-chip modules (MCMs) are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

The most common MCM is the "side-by-side" MCM. In this version two or more IC chips are mounted next to each other (or side by side each other) on the principal mounting surface of a common substrate. Interconnections among the chips and conductive traces on the substrate are commonly made via wire bonding. The side-by-side MCM, however, suffers from a disadvantage that the package efficiency is very low since the area of the common substrate increases with an increase in the number of semiconductor chips mounted thereon.

Therefore, the semiconductor industry develops a stacked chip package 100 (see FIG. 1) comprising two chips 110, 130 stacked each other. The chip 110 is attached onto the upper surface of a substrate 150 through an adhesive layer 112. An adhesive layer 132 is interposed between the chips 110, 130. The chips 110, 130 are respectively connected to wire bondable pads 152 on the upper surface of the substrate 150 through bonding wires 114, 134. The lower surface of the substrate 150 is provided with a plurality of solder pads 154 electrically connected to the wire bondable pads 152 on the upper surface of the substrate 150. Each solder pad 154 is provided with a solder ball 156 for making external electrical connection. A package body 160 encapsulates the chips 110, 130, the bonding wires 114, 134 and a portion of the upper of the substrate 150. However, the upper chip 130 will interfere wire bonding operation of the lower chip 110 when the upper chip 130 has a size close to the size of the lower chip 110. Moreover, comparing to the bonding wires 114 for chip 110, the bonding wires 134 for chip 130 have a much longer wire length and a much higher loop height thereby increasing the difficulty encountered in the wire bonding operation thereof. For example, longer wire with higher loop profile is more prone to break during wire bonding operation and to have problems of wire sweeping during encapsulation. Further, it requires a much thicker package body for stacked chip packages to encapsulate the stacked chips as well as bonding wires having a much longer wire length and a much higher loop height thereby reducing the packaging efficiency.

U.S. Pat. No. 5,973,403 discloses a multichip stacked device (see FIG. 2) comprising a wire-bonded semiconductor chip stacked on a flip-chip bonded semiconductor chip. The multichip stacked device comprises a first semiconductor chip 210 attached onto a substrate 220 by flip-chip bonding, and a second semiconductor chip 230 stacked on the first semiconductor chip 210 and wire-bonded to the substrate 220. The upper surface of the substrate 220 is provided with a plurality of wire bondable pads 222 and a plurality of flip-chip pads 224. The lower surface of the substrate 220 has a plurality of solder pads 226. The first semiconductor chip 210 is bonded to the flip-chip pads 224 through a plurality of solder joints. The second semiconductor chip 230 is bonded to the wire bondable pads 222 through a plurality of bonding wires 223. Since the lower semiconductor chip 210 is electrically connected to the substrate 200 by flip-chip bonding, the upper chip 230 will not become a hindrance to the lower chip 210.

However, when the chips 210, 230 are of the same type, address assignment of the bonding pads on the chips 210, 230 will mirror each other because the semiconductor chip 210 is oriented face down (with its bonding pads (not shown) down with respect to the substrate 220) for flip-chip bonding. Therefore, address assignment of the wire bondable pads 222 (i.e., address A1 to D7 shown in FIG. 3) should be a mirror image of that of the flip-chip pads 24 (i.e., address A'1 to D'7 shown in FIG. 3). This makes the circuit layout of the substrate become quite complicated and greatly increases the length and density of the conductive traces (not shown) of the substrate. Further, that will adversely affect the electrical performance of the package, since the impedance, the inductance, and the noise of the conductive traces are in proportion to the length of the conductive traces. High inductance makes package consume more electricity such that integrated circuit and traces inside the chip are more susceptible to power surges. Moreover, similar to the stacked chip package 100 described above, the bonding wires 223 for connecting chip 230 to the wire bondable pads 222 of the substrate 220 have a much longer wire length and a much higher loop height thereby increasing the difficulty encountered in the wire bonding operation thereof. As described above, longer wire with higher loop profile is more prone to break during wire bonding operation and to have problems of wire sweeping during encapsulation. And it requires a much thicker package body for stacked chip packages to encapsulate the stacked chips as well as bonding wires having a much longer wire length and a much higher loop height thereby reducing the packaging efficiency.

U.S. Pat. No. 5,801,072 discloses a multichip module comprising a first semiconductor chip attached onto the upper surface of a substrate by flip-chip bonding, and a second semiconductor chip attached onto the lower surface of the substrate also by flip-chip bonding. However, similar to the multichip stacked device disclosed in U.S. Pat. No. 5,973,403, when the upper and lower chips are of the same type, address assignment of the bonding pads on the upper and lower chips will mirror each other. Because the upper chip is flip-chip bonded to the substrate in a face-down orientation but the lower chip is flip-chip bonded to the substrate in a face-up orientation. This will makes the circuit layout of the substrate become quite complicated and greatly increases the length and density of the conductive traces (not shown) of the substrate. Further, that will adversely affect the electrical performance of the package, since the impedance, the inductance, and the noise of the conductive traces are in proportion to the length of the conductive traces. High inductance makes package consume more electricity such that integrated circuit and traces inside the chip are more susceptible to power surges.

The present invention therefore seeks to provide a multichip module which overcomes, or at least reduces the above-mentioned problems of the prior art.

SUMMARY OF THE INVENTION

It is a primary object of the present invention to provide a multichip module comprising two semiconductor chips of the same type respectively disposed on opposing upper and lower surfaces of a substrate wherein the two chips are respectively wire bonded and flip-chip bonded to the substrate thereby simplifying circuit layout of the substrate and significantly reducing the length of conductive traces formed on the substrate.

It is another object of the present invention to provide a multichip module comprising two semiconductor chips of the same type respectively disposed on opposing upper and lower surfaces of a substrate wherein the two chips are respectively wire bonded and flip-chip bonded to the substrate thereby significantly reducing overall thickness of the MCM so as to increase the packaging efficiency.

It is a further object of the present invention to provide a multichip module comprising two semiconductor chips of the same type respectively disposed on opposing upper and lower surfaces of a substrate wherein the two chips are respectively wire bonded and flip-chip bonded to the substrate thereby reducing the difficulty encountered in the wire bonding operation of the MCM.

It is still a further object of the present invention to provide a multichip module comprising two semiconductor chips of the same type respectively disposed on opposing upper and lower surfaces of a substrate wherein the two chips are respectively wire bonded and flip-chip bonded to the substrate thereby enhancing the electrical performance of the MCM.

The multichip module according to a preferred embodiment of the present invention mainly comprises a first chip disposed on the upper surface of a substrate by wire bonding and a second chip disposed on the lower surface of the substrate by flip-chip bonding wherein the first chip and the second chip are of the same type. The upper surface of the substrate is provided with a plurality of wire bondable pads. The lower surface of the substrate is provided with a plurality of flip-chip pads and a plurality of solder pads. The wire bondable pads and the flip-chip pads are electrically connected to corresponding solder pads.

Since the first chip and the second chip are oriented face up (with their bonding pads up with respect to the substrate) for bonding to the substrate, the address assignment of the bonding pads on the two chips conforms to each other. Therefore, circuit layout on the upper and lower surfaces of the substrate can use substantially the same design wherein common conductive traces on the upper and lower surfaces of the substrate are electrically connected by plated through holes.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 4:
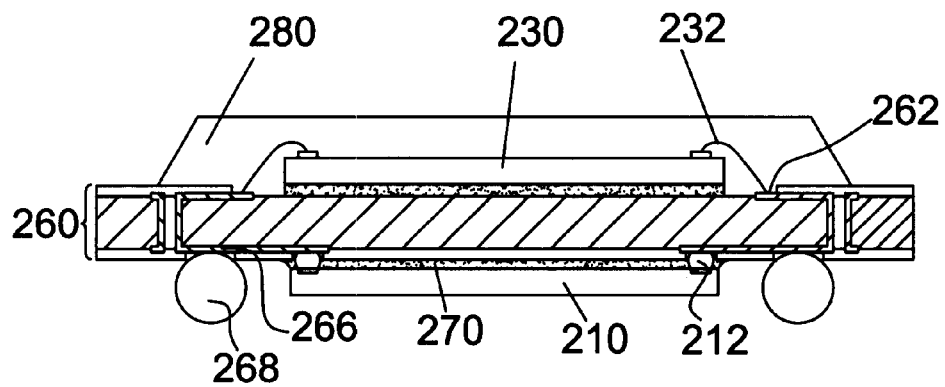
FIG. 4 is a cross sectional view of a multichip module according to a preferred embodiment of the present invention.

FIG. 4 shows a multichip module according to a preferred embodiment of the present invention. The multichip module mainly comprises two semiconductor chips 210, 230 respectively disposed on opposing upper and lower surfaces of a substrate 260. The upper surface of the substrate 260 is provided with a plurality of wire bondable pads 262. The lower surface of the substrate 260 is provided with a plurality of flip-chip pads 264 and a plurality of solder pads 266. The wire bondable pads 262 and the flip-chip pads 264 are electrically connected to corresponding solder pads 266 through conductive traces and plated through holes 261 formed within the substrate 260. Each solder pad 266 on the lower surface of the substrate 260 is provided with a solder ball 268 for making external electrical connection. Preferably, the substrate 260 may be formed from a core layer made of fiberglass reinforced BT (bismaleimide-triazine) resin or FR-4 fiberglass reinforced epoxy resin. Alternatively, the substrate 260 may be a ceramic substrate. The substrate in accordance with the present invention characterizes by only using two layers of printed circuits respectively formed on the upper and lower surfaces thereof to make up necessary electrical interconnection in the MCM of the present invention.

Referring to FIG. 4, according to the method for making the MCM in accordance with the present invention, the semiconductor chip 230 is securely attached onto the upper surface of the substrate 260 through an adhesive layer such as epoxy paste. The second semiconductor chip 230 is electrically connected to the wire bondable pads 262 through a plurality of bonding wires 232. The chip 230, bonding wires 232 and a portion of the upper surface of the substrate 260 are encapsulated in a package body 280. After that, the semiconductor chip 210 is bonded to the flip-chip pads 264 through a plurality of solder joints 212. It is preferable to form an underfill 270 interposed between the semiconductor chip 210 and the substrate 260 for strengthening and stabilizing the joints therebetween. Finally, solder balls 268 are mounted to the solder pads 266 formed on the lower surface of the substrate 260 for making external electrical connection.

Figure 5:
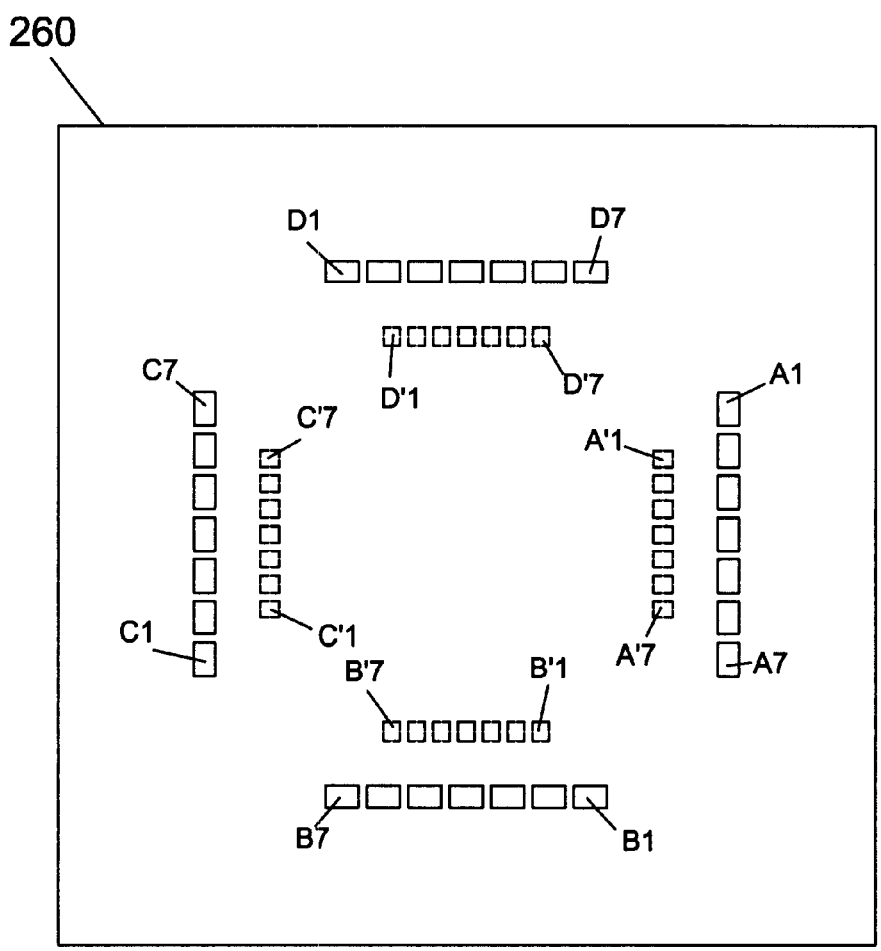
FIG. 5 is a top plan view of a substrate for use in forming the multichip module of FIG. 4.

When the chips 210, 230 are of the same type, bonding pads on the chips 210, 230 have a common address assignment. According to the present invention, the chip 210 is oriented face up (with its bonding pads up with respect to the substrate 260) for flip-chip bonding to the lower surface of the substrate 260, and the chip 230 is also oriented face up for wire bonding to the upper surface of the substrate 260. Thus, in the multichip module of the present invention, address assignment of the bonding pads on the chips 210, 230 conforms to each other. Therefore, address assignment of the wire bondable pads 262 of the substrate 260 (i.e., address A1 to D7 shown in FIG. 5) is the same as address assignment of the flip-chip pads 264 of the substrate 260 (i.e., address A'1 to D'7 shown in FIG. 5). Consequently, circuit layout on the upper and lower surfaces of the substrate 260 can use substantially the same design wherein common conductive traces on the upper and lower surfaces of the substrate are electrically connected by plated through holes thereby electrically interconnecting the chips 210, 230.

Figure 1:
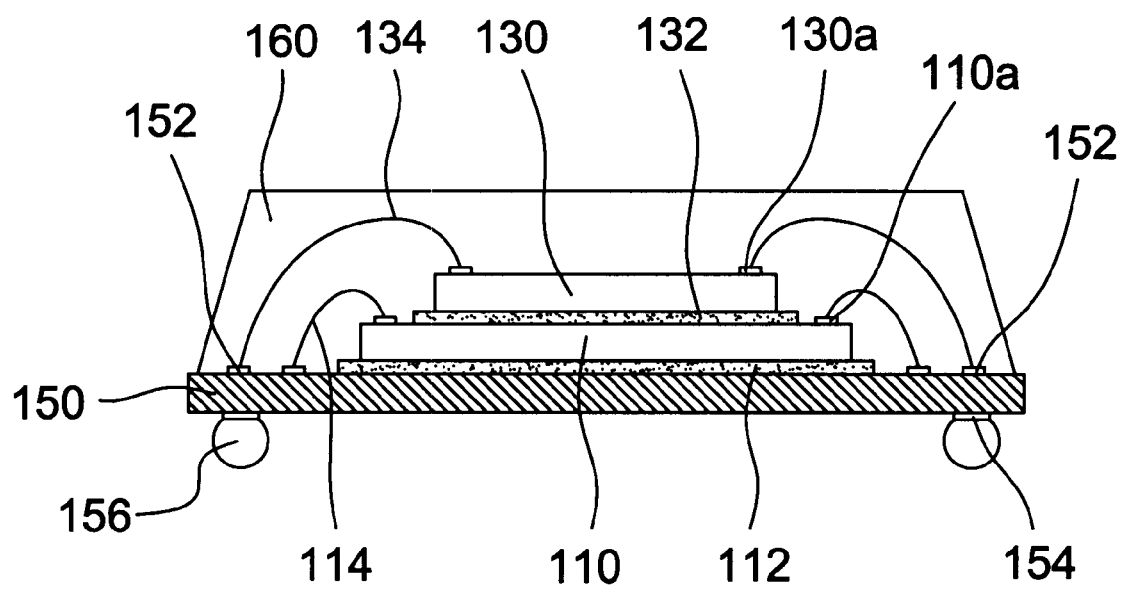
FIG. 1 is a cross sectional view of a conventional stacked chip package.
Figure 2:
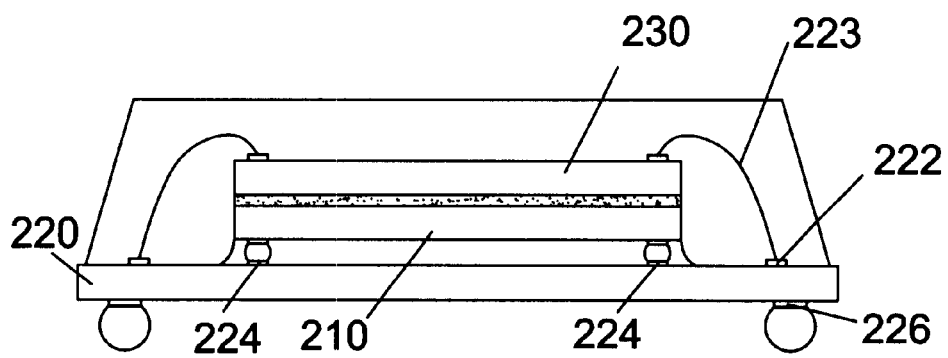
FIG. 2 is a cross sectional view of a multichip stacked device according to a preferred embodiment disclosed in U.S. Pat. No. 5,973,403.
Figure 3:
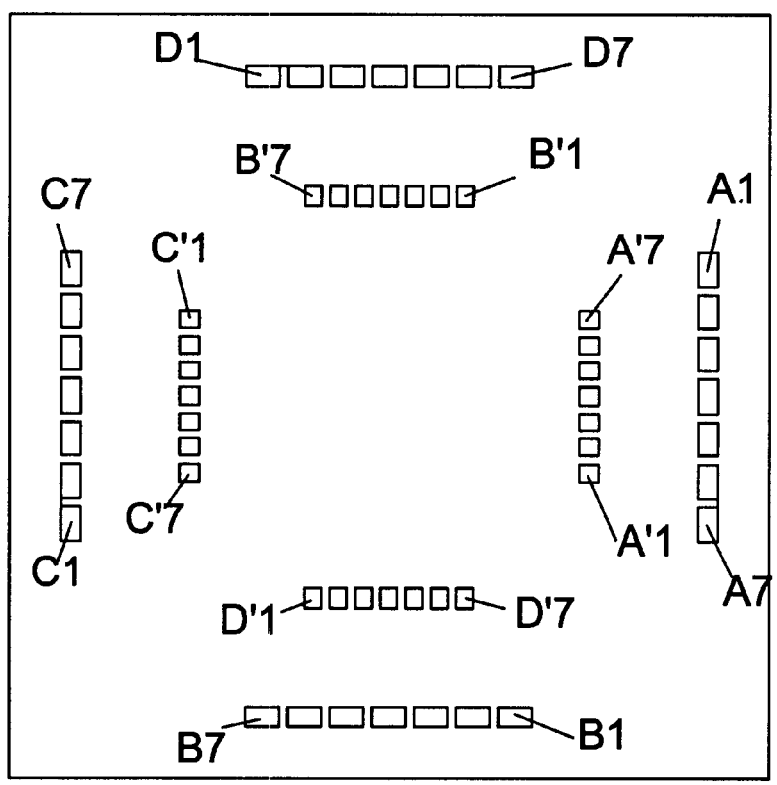
FIG. 3 is a top plan view of a substrate for use in forming the multichip stacked device of FIG. 2.

Comparing to the stacked chip package of FIG. 1 and the multichip stacked device of FIG. 2, the chip 230 adapted for wire bonding in the MCM of the present invention is directly attached onto the upper surface of the substrate 260 rather than stacked on another chip. Therefore, the bonding wires 232 for chip 230 have a much shorter wire length and a much lower loop height thereby reducing the problems encountered in the wire bonding operation of the chip 230 and increasing the product yield of the wire bonding operation. Further, shorter bonding wire has a better electrical performance and requires a thinner package body thereby promoting the packaging efficiency.

Comparing to U.S. Pat. No. 5,801,072 and U.S. Pat. No. 5,973,403, when the upper and lower chips of the packages disclosed therein are of the same type, the bonding pads on the upper and lower chips have a common address assignment. Thus, address assignment of the bonding pads on the upper and lower chips in U.S. Pat. No. 5,801,072 and U.S. Pat. No. 5,973,403 mirror each other thereby requiring a quite complicated circuit layout on the substrate to electrically interconnect the upper and lower chips. On the contrary, according to the present invention, the chips 210, 230 are both oriented face up (with their bonding pads up with respect to the substrate 260) for bonding to the substrate 260. Thus, address assignment of the bonding pads on the chips 210, 230 conforms to each other. Consequently, circuit layout on the upper and lower surfaces of the substrate 260 can use substantially the same design wherein common conductive traces on the upper and lower surfaces of the substrate 260 are electrically connected by plated through holes 261.

Although the invention has been explained in relation to its preferred embodiment, it is to be understood that many other possible modifications and variations can be made without departing from the spirit and scope of the invention as hereinafter claimed.

What is claimed is:

1. A multichip module, comprising:
   a substrate having opposing upper and lower surfaces, the upper surface of the substrate having a plurality of wire bondable pads, the lower surface of the substrate having a plurality of flip-chip pads and a plurality of solder pads, the wire bondable pads and the flip-chip pads being electrically connected to the corresponding solder pads;
   a first semiconductor chip disposed on the upper surface of the substrate, the first semiconductor chip having a plurality of first bonding pads electrically connected to the corresponding wire bondable pads through a plurality of bonding wires; and
   a second semiconductor chip disposed on the lower surface of the substrate, the second semiconductor chip having a plurality of second bonding pads electrically connected to the corresponding flip-chip pads through a plurality of solder joints;
   wherein the first semiconductor chip and the second semiconductor chip have a common address assignment and are both disposed with the first and second bonding pads, respectively, facing upwards.

2. The multichip module as claimed in claim 1, wherein the first semiconductor chip and the second semiconductor chip substantially have the same size.

3. The multichip module as claimed in claim 1, further comprising a plurality of solder balls disposed on the solder pads of the substrate.

4. The multichip module of claim 1, wherein:
   the first semiconductor chip has an upper surface on which the first bonding pads are arranged and a lower surface which is attached to the upper surface of the substrate; and
   the second semiconductor chip has a lower surface and an upper surface on which the second bonding pads are arranged.

5. The multichip module of claim 4, wherein layouts of circuitry on the upper and lower surfaces of the substrate have substantially the same configuration.

6. The multichip module of claim 4, further comprising a under fill between the upper surface of second semiconductor chip and the lower surface of the substrate.

7. A method of making a multichip module, comprising:
   providing a substrate having opposing upper and lower surfaces, the upper surface of the substrate having a plurality of wire bondable pads, the lower surface of the substrate having a plurality of flip-chip pads and a plurality of solder pads;
   attaching a first semiconductor chip onto the upper surface of the substrate, the first semiconductor chip having a plurality of first bonding pads;
   wire bonding the bonding pads of the first semiconductor chip to the corresponding wire bondable pads of the substrate; and
   disposing a second semiconductor chip having a plurality of second bonding pads on the lower surface of the substrate, so that the second bonding pads are electrically connected to the corresponding flip-chip pads of the substrate through a plurality of solder joints;
   wherein the first semiconductor chip and the second semiconductor chip have a common address assignment and are both disposed with the first and second bonding pads, respectively, facing upwards.

8. The method as claimed in claim 7, further comprising a step of attaching a plurality of solder balls to the solder pads of the substrate.

9. The method of claim 7, wherein
   said attaching comprises orienting the first semiconductor chip so that an upper surface of the first semiconductor chip on which the first bonding pads are arranged is facing upwards, and securing a lower surface of the first semiconductor to the upper surface of the substrate; and
   said disposing comprises attaching an upper surface of the second semiconductor chip, on which the second bonding pads are arranged, to the lower surface of the substrate.

10. The method of claim 9, wherein layouts of circuitry on the upper and lower surfaces of the substrate have substantially the same configuration.

* * * * *